United States Patent
Miller et al.

(10) Patent No.: US 8,028,211 B1
(45) Date of Patent: Sep. 27, 2011

(54) LOOK-AHEAD BUILT-IN SELF TESTS WITH TEMPERATURE ELEVATION OF FUNCTIONAL ELEMENTS

(75) Inventors: Michael Miller, Saratoga, CA (US);
Chuen-Der Lien, Los Altos Hills, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 402 days.

(21) Appl. No.: 12/268,854

(22) Filed: Nov. 11, 2008

Related U.S. Application Data

(63) Continuation-in-part of application No. 11/960,618, filed on Dec. 19, 2007, now Pat. No. 7,877,657.

(60) Provisional application No. 60/908,934, filed on Mar. 29, 2007.

(51) Int. Cl.
  *G01R 31/3187* (2006.01)
  *G01R 31/40* (2006.01)
(52) U.S. Cl. .................................. 714/733; 714/718
(58) Field of Classification Search .................. None
  See application file for complete search history.

(56) References Cited

U.S. PATENT DOCUMENTS

| | | | |
|---|---|---|---|
| 3,184,552 A | 5/1965 | Macrander | |
| 6,226,764 B1 | 5/2001 | Lee | |
| 6,363,506 B1 | 3/2002 | Karri et al. | |
| 6,574,760 B1 | 6/2003 | Mydill | |
| 6,707,718 B1 | 3/2004 | Halim et al. | |
| 6,842,714 B1 * | 1/2005 | Acar et al. | 702/136 |
| 6,862,721 B2 | 3/2005 | Templeton et al. | |
| 6,886,119 B2 | 4/2005 | Vancura | |
| 7,480,842 B1 | 1/2009 | Young et al. | |
| 2005/0024114 A1 * | 2/2005 | Banik | 327/215 |
| 2005/0182588 A1 * | 8/2005 | Chenoweth et al. | 702/118 |
| 2006/0271807 A1 | 11/2006 | Suzuki et al. | |

FOREIGN PATENT DOCUMENTS
JP 11330259 A * 11/1999

OTHER PUBLICATIONS

Micron Abramovici and Charles E. Stroud, "BIST-Based Delay-Fault Testing in FPGAs," Journal of Electronic Testing: Theory & Applications, vol. 19, No. 5, pp. 549-558, 2003.
Puneet Gupta, "High Quality Transition and Small Delay Fault ATPG," Submitted to Faculty of Virginia Polytech Institure and State University, Bradley Department of electrical and Computer Engineering, Feb. 13, 2004. .

* cited by examiner

*Primary Examiner* — Jeffrey A Gaffin
*Assistant Examiner* — Dipakkumar Gandhi
(74) *Attorney, Agent, or Firm* — Kenneth Glass; Glass & Associates

(57) ABSTRACT

A method and apparatus are disclosed for predicting the failure of a functional element of an integrated circuit during operation. The method includes determining whether the functional element of the integrated circuit device is in an idle cycle, elevating the temperature of the functional element above a normal operating temperature, performing a stress test of the functional element while the functional element is in the idle cycle, and indicating that the functional element, if it fails the stress test, is a potential future failing element. The stress test can include simultaneously providing a margining test voltage and a stress clock signal to the functional element while the temperature is elevated or at a normal operating temperature. The stress test is performed in the background, during continuous operation of the integrated circuit device, such that normal operation of the integrated circuit device is not interrupted. Thereby, the method and apparatus of the present invention allows for failure prediction in a device before it happens, allowing for planned outages or workarounds and avoiding system downtime for unplanned repairs.

27 Claims, 8 Drawing Sheets

LOOK-AHEAD BUILT-IN SELF TESTS WITH TEMPERATURE ELEVATION OF FUNCTIONAL ELEMENTS

CROSS-REFERENCE TO RELATED APPLICATIONS

The present application claims benefit of U.S. Provisional Patent Application Ser. No. 60/908,934, filed Mar. 29, 2007, entitled "LOOK-AHEAD BUILT-IN SELF TESTS" and U.S. patent application Ser. No. 11/960,618, filed Dec. 19, 2007, entitled "LOOK-AHEAD BUILT-IN SELF TESTS".

BACKGROUND OF THE INVENTION

Modern complex electronic devices are rigorously tested during and after production. As electronic devices are implemented in ever smaller geometries, there is an increasing chance of failure over the life of a device due to changes resulting from changes in the materials. One well-known change resulting from device-material-drift is negative bias temperature instability (NBTI). Another is the "hot carrier effect". Both can change device behavior during operations. Resistances of conductors in a device can also change over time due to electro-migration.

Several phenomena can reduce the reliability margin of a device. One is the total number of elements (e.g., transistors, interconnects, contacts, vias, etc.) in a device. If the probability of failure in an element remains relatively constant and thus the failure rate in time (FIT) per element stays constant, the overall FIT of the product will degrade. Another phenomenon reducing reliability is the higher, near-marginal, demand placed on each element to extract maximum performance as technologies advance. This increases the FIT rate of each element. Another phenomenon is the tightening of system reliability requirements.

Failures resulting from these phenomena are often only discovered later in the life of a system, long after manufacture and initial testing. Even very complex devices can survive a myriad of in-production and post-production tests but still harbor potential failures that aren't discovered until late in the device's life. Such failures can be detected after installation but usually require that the appliance or system in which a device operates is taken out of operation for testing.

When a system fails as a result of a failure of a complex semiconductor device in it, Built-in Self Test (BIST), usually exercised at power-up, can be used to locate the failed device for replacement. However, the locating and replacing do not take place until the system fails, incurring the cost and inconvenience of a system shutdown of the entire system or a board. The cost can also be in lost operating revenue and/or redundant functional boards and systems as back up for failures.

If a device is known to be developing a failure, its replacement can be planned and accommodated at a minimum impact to the system. However, predicting failure is not easy. One possible way to detect failure is to subject the device to a stress test in which the device is stressed beyond normal operation. Another way to detect failure is to collect electrical parameters (e.g., delays of selected paths) statistically under normal and/or stressed conditions across time and predict failure trend.

What is needed, then, is a means of subjecting a complex semiconductor device to high-stress test conditions and/or parameter measurements and identifying potential failures from the results of the stress testing and/or trends of parameters change. Such a means of testing should allow continued operation of the system in which the complex device is operating and it should be built into the device or the system.

SUMMARY OF THE INVENTION

A method and apparatus are disclosed for predicting failure of a functional element of an integrated circuit device using look-ahead built-in self-testing that is performed during operation of the integrated circuit device. The method includes determining whether the functional element of the integrated circuit device is in an idle cycle, elevating the temperature of the functional element when the functional element is determined to be in an idle cycle, performing a stress test of the functional element while the functional element is in the idle cycle and at the elevated temperature, and if the functional element fails the stress test, identifying it as a potential future failing element.

Elevating the temperature of the functional element may be accomplished by toggling the input signals to the functional element at a clock rate that is faster than the normal operational clock rate of the functional element or by applying a voltage to the functional element that is higher than the normal supply voltage of the functional element. Elevating the temperature of the functional element in accordance with the present invention allows for selective, temporary heating of the circuit to be tested which is cost effective and does not impact the performance of the functional element during normal operation.

The stress test may include providing a margining test voltage and/or a stress clock signal to the functional element while the functional element is at an elevated temperature and in an idle cycle. In addition, the stress test may include running a standard test on the functional element when the functional element is at an elevated temperature and in an idle cycle.

In the present embodiment elevating the temperature of the circuit device and performing the stress test are accomplished in the background, during continuous operation of the integrated circuit device, such that normal operation of the integrated circuit device is not interrupted. Thereby, the method and apparatus of the present invention allows for failure prediction in a device before it happens, allowing for planned outages or workarounds and avoiding system downtime for unplanned repairs and the extra cost of complete redundant systems and boards.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits will not be described in detail so as to avoid obscuring aspects of the present invention. At times, concepts disclosed in this discussion of embodiments of the present invention will be made more readily apparent by reference to the Figures.

Figure 1:
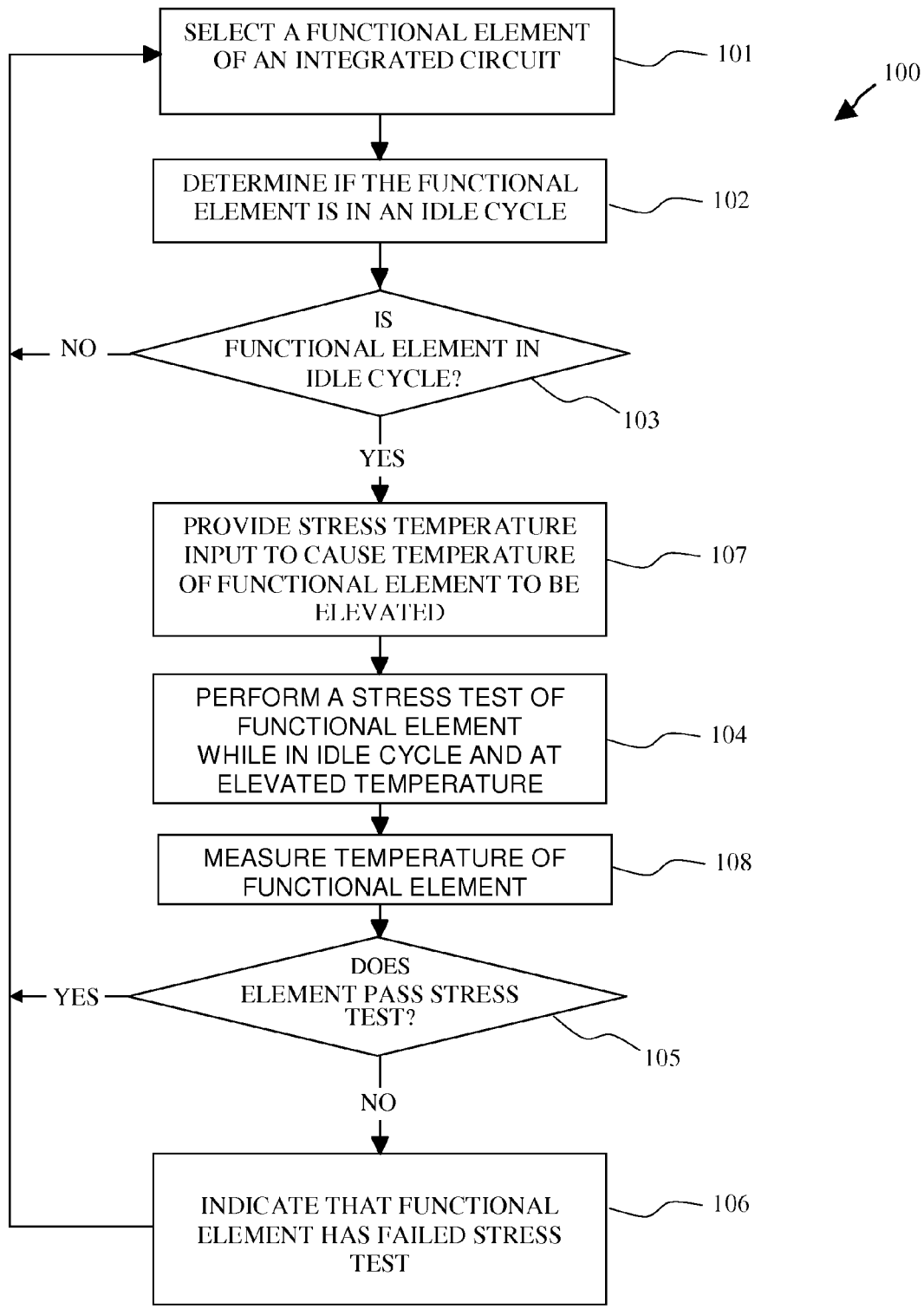
FIG. 1 illustrates, in flow chart form, a method for predicting the failure of a functional element of an integrated circuit device in accordance with an embodiment of the present invention.

FIG. 1 illustrates, in flow chart form, a method 100 for predicting the failure of a functional element of an integrated circuit device. At step 101 a functional element of the integrated circuit device is selected. Selecting is accomplished, in one embodiment, by seeking functional elements that are in an idle cycle in the operation of the integrated circuit device. In one embodiment of the present invention, functional elements in an integrated circuit device are selected sequentially by an operational stress test controller.

In the present embodiment, method 100 is performed on an integrated circuit device by internal circuitry of that integrated circuit device in normal operation in its end-use application. More particularly, method 100 is not performed during testing of an integrated circuit device on a burn-in board or other testing apparatus, but rather is performed after the integrated circuit device has shipped to an end-use customer and has been incorporated into an end-use computing system and during normal operation. The end-use computing system may be, for example, a high-speed router in a large, high-traffic, local area network (LAN). The router, and the LAN, must continue to function in order to ensure the continued operation and reliability of the LAN. Embodiments of the present invention are enabled to test functional elements of the integrated circuit devices in such critical systems, under extreme operating conditions, without incurring the onus of having to take the systems, or their component appliances, offline to accommodate the testing. Embodiments of the present invention can predict failure in such critical integrated circuit devices without interruption of their end uses. Embodiments can be made to detect slack periods of uses as small as one clock cycle and perform the test in the same period without effecting operation of the rest of the system, thus avoiding redundant circuits to make up for "offline" diagnostics.

It is noted that the integrated circuit device can be any type of semiconductor device such as a logic function, memory, complex programmable logic device (CPLD), field-programmable gate array (FPGA), or other complex device in which built-in self-test (GIST) is implemented. A functional element of an integrated circuit device can be a segment of memory, a logic gate array, or some other element or group of elements in a complex array of functional elements.

The method determines at 102, whether the functional element is in an idle cycle. In most integrated circuit devices, a specific functional element is actually active for only a part of the operating time of the integrated circuit device, and enters an active cycle only when called upon by some other element. Those operational periods in which a functional element is not in an active cycle, referred to hereinafter as "idle cycles," can be identified in any of a number of different ways, depending on the architecture of the integrated circuit device. In an embodiment when a functional element select line is used to activate functional elements the functional element is determined to be in an idle cycle when the functional element select line is not selected.

In one embodiment of the present invention, the active and idle cycles experienced by a functional element coincide with system clock signal cycles. In another embodiment, the active and idle cycles are of a different time span, the active and idle cycles being dictated by the application of the integrated circuit device.

At step 103, if the selected element is not in an idle cycle, another functional element is selected at 101. If no functional element is found to be in an idle cycle, process 100 continues until a functional element is found that is in an idle cycle. In this embodiment, continuously searching for functional elements that are in an idle cycle enables testing of all functional elements in the integrated circuit device.

Referring now to step 104, if the element selected in step 101 is in an idle cycle, then in step 107 the temperature of the functional element is elevated above the normal operating temperature of the functional element. After the temperature of the functional element has been elevated, a stress test is performed on the functional element in step 104. Accordingly, temperature elevation and stress testing are performed during the idle cycle of the functional element. In the embodiment of the present invention in which active and idle cycles of a functional element coincide with system clock signal cycles, the temperature elevation and stress testing takes place during the system clock signal cycle that is determined to be an idle cycle.

Because heating is a normal byproduct of operating circuitry, increasing the frequency of any logic circuit will cause the circuit to consume more power and therefore raise the temperature of the die. Raising the temperature of the functional element at least a degree or two is enough to create a difference that creates a condition for margin testing of the functional element. In the present invention, the temperature of the functional element is elevated by applying a stress temperature input to the functional element. In a particular embodiment of the present invention, applying a stress temperature input to the functional element includes toggling an input to the functional element at a clock rate that is faster than a normal internal clock signal used by the functional element. The input to the functional element may be toggled at varying rates. In addition, various logic patterns can be used for the input, including a predetermined worst case logic pattern. Toggling the inputs to the functional element at a higher than normal clock frequency creates heat through the subsequent charging and discharging capacitance of the functional element circuitry.

In an additional embodiment, elevating the temperature of the functional element is accomplished by raising the supply voltage to the functional element. Raising the supply voltage to the functional element results in a rise in the temperature of the functional element due to increased leakage. Raising the temperature of the functional element in this manner is particularly effective at smaller process geometries. In this embodiment, the supply voltage would be returned to the normal operating range prior to performing the stress test on the functional element.

In one embodiment of the present invention, the stress test includes performing a standard test on the functional element while the temperature of the functional element is elevated. In this embodiment, a standard test involves the application of a logic signal pattern to the functional element which is within the normal operating specifications of the functional element. In this embodiment, the elevated temperature provides the stress condition for the functional element. By elevating the temperature of the functional element and running a standard test on the functional element at the elevated temperature, a potentially future failing element can be identified and flagged by comparing the actual output of the functional element to an expected output.

Various methods of elevating the temperature of the functional element in accordance with the present invention have been described. It is envisioned that these methods can be used alone or in combination with each other to attain the desired temperature elevation for the functional element prior to stress testing.

In an additional embodiment of the present invention, the stress test may include either a voltage margin test and/or a timing margin test performed during the elevated temperature of the functional element, such that the stress condition for the functional element is provided in combination by the temperature elevation, the voltage margin test and/or the timing margin test. In another embodiment, time-margining, voltage margining and the combination of time and voltage margining are all three implemented during the stress test, resulting in varying stress levels.

Voltage margin testing subjects the tested functional element to a margining test voltage. The margining test voltage may be a supply voltage that is higher or lower than the normal supplied voltage. In one embodiment, a lower voltage is supplied to the functional element being tested while the element is required to execute an operation. The time taken to execute the operation under reduced voltage, compared with the time taken at standard voltage, is a result of the testing. In another embodiment, a higher than normal voltage is supplied for the test.

By subjecting the element to an operating voltage that is higher or lower than normal, the function of the element is examined at the margins of its specified operating capability. It is noted that a functional element can fail a built-in stress self-test at the margin of operation even though it is operating normally at voltages in the middle of the operating specification, or envelope. If such a failure occurs it is highly probable that the element's performance is in the process of degrading and that a failure will occur while operating within the specified operating envelope. Built-in stress self-test of the present invention, by using a margining voltage, can determine if such failure is going to occur and can identify or flag the element as a potentially failing element.

Time-margin testing uses a stress clock signal in lieu of a normal internal clock signal. A stress clock signal is provided to force a functional element to perform an operation within a specified time. In one embodiment of the present invention, the stress clock signal has the same frequency but a shorter pulse duration than the normal clock signal. The difference in pulse duration is a timing margin. In a stress test using the stress clock signal, a stress test function initiated on the normal clock signal should cycle by the end of the stress clock pulse. This shortened timing is a time margin testing method.

In an additional embodiment, the stress clock signal has the same frequency and the same pulse length as a normal internal clock signal, but the phase of the stress clock signal is slightly ahead of the normal clock signal. In time-margin stress testing in this embodiment, a test operation is initiated on the normal clock pulse but is timed to the contemporary, or nearest in time, stress clock signal pulse. If the test operation does not complete by the end of the stress clock pulse, the test is indicated as a failed test.

In another embodiment of the present invention, time margin testing includes a delay fault test. In this embodiment, the time delay between a test input to a desired pathway through a device or a functional element is compared to a time standard for the given pathway. This delay fault test measures and logs the time lag between input and output on the pathway. In another embodiment, time delay fault testing is conducted on two identical, or nearly identical, pathways. The pathways are stressed under the embodiment's stress testing regimens and the time delay is compared between the two.

Referring still to FIG. 1, if the functional element passes the stress testing 105, another functional element is selected for testing at 101. If the functional element does not pass built-in stress-self-testing at 105, an indication is provided that the functional element has not passed the stress test. This indicates that the element is a potential future failing element (an element having possible future failure). In the present embodiment this indication is a flag that is activated to indicate that the functional element identified at 106 has failed the stress test. The identification of the potential future failure of a functional element enables the repair or replacement of the functional element before it fails in normal operation. In a critical application, such as a router in a critical network for example, such pre-emptive repair can prevent the loss of service that a failure during operation can entail.

In an additional embodiment, a temperature sensor can be used to measure the temperature of the functional element at 108 while the stress test is being performed at 104 and the measured temperature can be correlated to the stress conditions to allow for failure analysis of the functional element.

In one embodiment a log or other indicia is generated that indicates the identity of all elements that fail the stress test. In one embodiment this log or other indicia is then stored in the integrated circuit device.

Method 100 provides for stress testing of elements while the integrated circuit device is operating, enabling recurring testing of functional elements to ascertain whether a functional element is becoming a potentially failing element, without having to take the integrated circuit device off line. Moreover, the integrated circuit device does not have to be powered down and powered back up, or be placed in a dedicated test mode.

Figure 2:
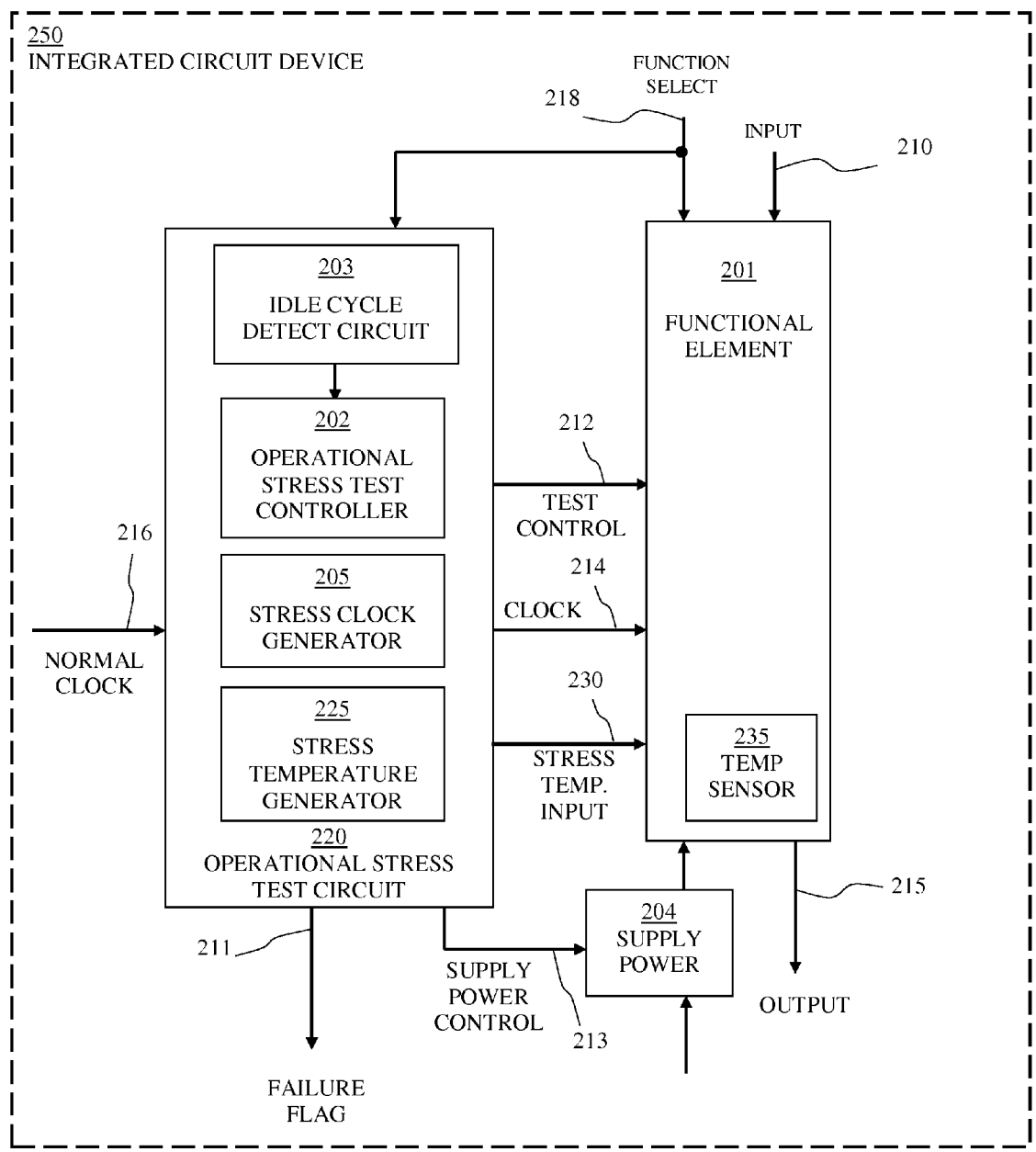
FIG. 2 illustrates a functional block diagram of an apparatus for predicting a failure of a functional element of an integrated circuit device in accordance with an embodiment of the present invention.

FIG. 2 illustrates a functional block diagram of a system 200 for predicting a failure of a functional element in an integrated circuit device in accordance with an embodiment of the present invention. System 200 includes an integrated circuit device 250. In one embodiment of the present invention, integrated circuit device 250 is a field-programmable gate array (FPGA). In another embodiment, integrated circuit device 250 is a system-on-chip (SOC). In addition, integrated circuit device 250 can be a static random access memory (SRAM) device, a dynamic random access memory (DRAM) device, a first-in first out (FIFO) device, a multi-port device, a content addressable memory (CAM) device, or any other type of integrated circuit device that includes a functional element 201 that performs a particular function in the normal operation of the integrated circuit device 250. In one embodiment integrated circuit device 250 is a single semiconductor die. However, alternatively, integrated circuit device 250 can include multiple semiconductor die that are electrically coupled together such as, for example, a multi-chip module that is packaged in a single integrated circuit package.

Integrated circuit device 250 includes a functional element 201 that is operable to perform a specific function in the normal operation of integrated circuit device 250. Functional element 201 receives an input 210, supply power 204, clock 214 and test control 212 functions, and has an output 215. In one embodiment, functional element 201 is a logic block in an application-specific integrated circuit (ASIC). In still another embodiment, functional element 201 is a block in a programmable system-on-chip (PSOC) that is incorporated as needed into a programmed configuration of the PSOC. In yet another embodiment, functional element 201 is a section of memory in a device that includes memory.

In FIG. 2, operational stress test circuit 220 is shown only in relation to functional element 201 for the purpose of clarity. However, in this embodiment of the present invention, operational stress test circuit 220 is coupled to, and is enabled to test a plurality of functional elements. In one embodiment operational stress test circuit 220 is coupled to, and is enabled to test all of the functional elements of integrated circuit device 250.

At times during operation of integrated circuit device 250, functional element 201 is in an active cycle and at other times functional element 201 is in an inactive cycle. It is noted here that many functional elements of complex semiconductor devices typically are in active cycles for relatively small fractions of the operating life of the overall device. Accordingly, there are frequent idle cycles in which a particular functional element is not active. In the present embodiment operational stress test circuit 220 includes idle cycle detect circuit 203 that is operable to detect these idle cycles.

In the present embodiment operational stress test circuit 220 receives the normal internal clock signal of integrated circuit device 250 through clock line 216 and the function select signal through a function select line 218. In this embodiment, function select line 218 is electrically coupled to idle cycle detect circuit 203. When function select line 218 is not activated, it indicates to idle cycle detect circuit 203 that functional element 201 is in an idle cycle. In the present embodiment idle cycle detect circuit 203 is electronically coupled to the function select lines 218 for each functional element 201 that operational stress test circuit 220 is enabled to stress test.

During normal operation of integrated circuit device 250, when functional element 201 is active, operational stress test circuit 220 stands by until a functional element 201 is indicated as being in an idle cycle by idle cycle detect circuit 203. When functional element 201 is indicated as being in an idle cycle operational stress test circuit 220 performs a stress test on functional element 201.

Test control connection 212 and clock signal connection 214 couple operational stress test circuit 220 to functional element 201. In one embodiment, in addition to providing control signals to functional element 201, test control connection 212 couples test output from functional element 201 to operational stress test controller 202. Test control connection 213 couples operational stress test circuit to supply power 204 so as to allow for control of power to functional element 201. Thereby, operational stress test circuit 220 provides a higher or lower than normal operating voltage to functional element 201 for stress testing.

In this embodiment, stress temperature generator 225 is coupled to the operational stress test controller 202 of integrated circuit 250 and is operable to elevate the temperature of the functional element. In particular, the stress temperature generator 225 is operable to elevate the temperature of the functional element 201 by generating an input to the functional element 201 that causes the temperature of the functional element 201 to be elevated above its normal operating temperature. In one embodiment of the present invention, the stress temperature generator 225 is operable to elevate the temperature of the functional element 201 by toggling a stress temperature input 230 to the functional element 201 with a logic signal pattern at a clock rate that is faster than a normal internal clock signal used by the functional element. In an exemplary embodiment, the stress temperature generator 225 provides a logic signal pattern at an input 230 to the functional element 201 at a rate that is twice the normal internal clock signal used by the functional element 201. Operating the functional element 201 at twice the normal clock rate causes a marginal rise in the temperature of the functional element 201, thereby causing a stress test condition. While the functional element 201 is being heated in this manner, the output 215 of functional element 201 is ignored. After the functional element 201 has been sufficiently heated, which may require the use of several cycles of the logic signal pattern, a standard test is run on the functional element 201 to identify whether or not the functional element 201 passes the stress test. If it does not pass the stress test, it is a potential future failing functional element. The standard test is performed at the normal internal clock signal rate of the functional element 201. Additional embodiments of the inventions include elevating the temperature of the functional element 201 by toggling the input at 3×, 4×, etc. of the normal internal clock signal. Various logic signal patterns are within the scope of the present invention, including the use of a fixed worst case pattern.

In an additional embodiment, the stress temperature generator 225 is operable to elevate the temperature of the functional element 201 by driving a supply voltage input 204 of the functional element 201 with a voltage that is higher than a normal operating voltage of the functional element 201. Applying a higher than normal operating voltage to the functional element 201 causes a temporary heating of the functional element 201. As in the previous embodiment, after the functional element 201 has been sufficiently heated, the voltage is returned to a normal operating range and a standard test is run on the functional element 201 to identify whether or not the functional element 201 passes the test under this stress condition. Various methods of elevating the temperature of the functional element in accordance with the present invention have been described. It is envisioned that these methods can be used alone or in combination with each other to attain the desired temperature elevation for the functional element prior to stress testing.

In the present embodiment operational stress test controller 202 includes logic for initiating the temperature elevation of the functional element, initiating the stress test and analyzing the test results for determining whether or not the functional element 201 passes the stress test. When operational stress test circuit 220 implements a stress test of functional element 201, failure flag 211 indicates whether functional element 201 passes the stress test. Thereby, failure flag 211 indicates that the failing functional element is a potential future failing element. Functional element 201 remains in service, even if it failed the stress test, until taken out of service by some means such as built-in self-repair or another process initiated by the system administrator.

In another embodiment, in addition to elevating the temperature of the functional element, the functional element can also simultaneously be subjected to additional stress utilizing the stress clock generator 205 of the present invention. Stress clock generator 205 is coupled to the normal internal clock signal 216 of integrated circuit device 250 and is operable to generate a stress clock signal. In one embodiment of the present invention, the stress clock signal has the same frequency but a shorter pulse duration than the normal clock signal. In another embodiment, the stress clock signal has the same frequency and the same pulse duration as the normal clock signal, but is phased slightly ahead of the normal clock signal. The stress clock signal and the normal clock signal are coupled to the functional element 201 as shown by arrow 214. More particularly, during active cycles of functional element 201 the normal clock signal is provided to functional element 201 and during stress testing the stress clock signal is provided to functional element 201.

Operational stress test circuit 220 also includes operational stress test controller 202 and a stress clock generator 205. In the present embodiment operational stress test controller 202 is operable to control the operations of operational stress test circuit 220. Operational stress test controller 202 is electrically coupled to receive the output of functional element 201 and is electrically coupled to stress clock generator 205, to the stress temperature generator 225 and to supply voltage control 213. In the present embodiment, operational stress test controller 202 controls functional element clock input 214 and test control line 212. In addition, operational stress test controller 202 is enabled to control 213 the power supply 204 to supply a higher or lower supply voltage to functional element 201.

In an additional embodiment of the present invention, the stress temperature generator 225 and the stress clock generator 205 can be used in combination to stress test the functional element 201. In this embodiment, the stress clock signal generated by the stress clock generator 205 would be used to test the logic of the functional element 201 in place of the standard test. As such, the stress temperature generator 225 can be used to first elevate the temperature of the functional element 201 and then the stress clock generator 205 can be used to generate a stress clock signal to identify whether or not the functional element 201 is a future failure. In this embodiment, the functional element 201 is stressed by both the elevated temperature and the stress clock signal.

In this embodiment of the present invention, operational stress test circuit 220 is implemented as part of the integrated circuit device whose functional elements are subject to background testing. In another embodiment, operational stress test circuit 220 is a standalone device, built into the application system that is enabled to implement stress testing in more than one integrated circuit device.

In the present embodiment operational stress test controller 202 includes logic for initiating the stress test and analyzing the test results for determining whether or not functional element 201 passes the stress test. When operational stress test controller 220 implements a stress test of functional element 201, failure flag 211 indicates whether functional element 201 passes the stress test. Thereby, failure flag 211 indicates that the failing functional element is a potential future failing element. Functional element 201 remains in service, even if it failed the stress test, until taken out of service by some means such as built-in self-repair or another process initiated by the system administrator.

In an additional embodiment, a temperature sensor 235 is coupled to the functional element 201 and to the operational stress test controller 202. The temperature sensor 235 is used to measure the temperature of the functional element 201 during the stress testing. As such, if the functional element 201 is identified as a potential future failing element, the measured temperature can be correlated with the testing conditions to allow for improved analysis of the functional element 201.

It is noted here that conventional built-in self-tests are typically accomplished when products are powered up or are out of operation mode and in a test mode. For example, conventional built-in self-tests are commonly done during manufacturing testing prior to shipping a completed integrated circuit device to a customer for implementation into a system. Self-tests can also be implemented during power-up or reset of the apparatus. However, in conventional integrated circuit devices, test circuits are inactive during normal operation of the devices. To take advantage of the circuit inactivity, embodiments of the present invention enable built-in stress self-tests to be accomplished during continuous operation of the integrated circuit device. Thereby failure testing is performed in an ongoing basis, during operation of the integrated circuit device, such that failure can be predicted in the integrated circuit device before it happens, allowing for planned outages or workarounds and avoiding system downtime for unplanned repairs.

Figure 3:
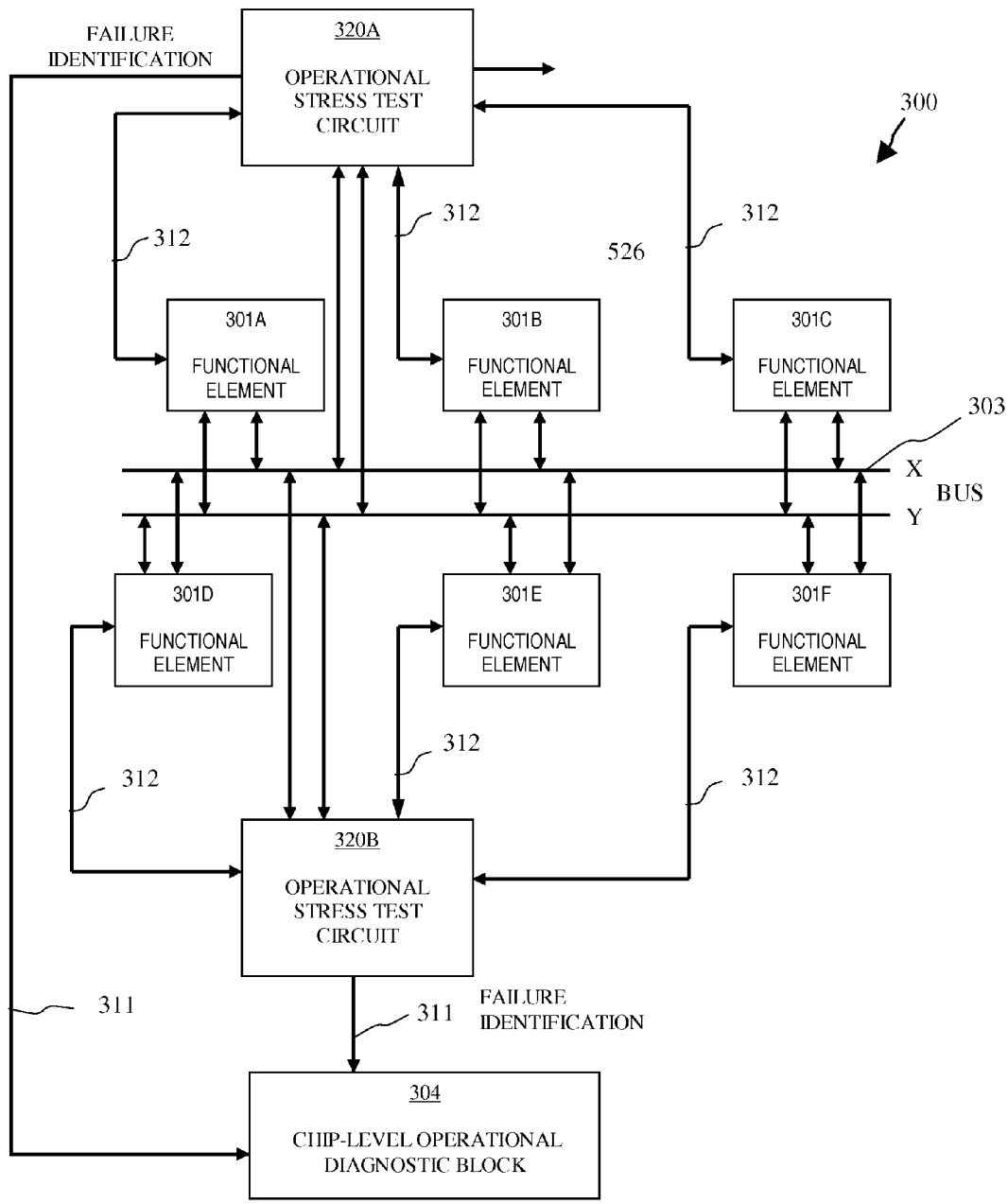
FIG. 3 illustrates a functional block diagram of an apparatus for predicting a failure of a functional element in a bus-architecture integrated circuit device in accordance with an embodiment of the present invention.

FIG. 3 illustrates a functional block diagram of a bus-architecture integrated circuit device 300 that includes operational stress test circuits 320A and 320B for predicting a failure of a functional element in accordance with an embodiment of the present invention. Integrated circuit device 300 can be a memory device, programmable logic device, an application-specific integrated circuit device or other device in which the functional elements are interconnected by one or more buses. In system 300, functional elements 301A-301F are interconnected by bus 303 that includes inputs and outputs to and from functional blocks 301A-301F. In one embodiment bus 303 provides function select input to functional blocks 301A-301F and to operational stress test circuits 320A-320B. Thereby operational stress test circuits 320A-320B can determine when function blocks 301A-301B are in an idle cycle.

In the present embodiment operational stress test circuits 320A and 320B are coupled to functional elements 301A-301F by dedicated test connections 312 such that stress tests can be performed on functional elements 301A-301F.

In one embodiment, each of operational stress test circuits 320A and 320B includes an idle cycle detect circuit, an operational stress test controller, a stress clock generator, and a stress temperature generator, and are operable in a similar manner to operational stress test circuit 220 of FIG. 2 to perform stress tests on functional elements 301A-301F. In the present embodiment connections 312 electrically couple operational stress test circuit 320A to functional elements 301A-301C such that operational stress test circuit 320A can provide clock signals, control power, initiate testing and receive test output from functional elements 301A-301C. Similarly, connections 312 electrically couple operational stress test circuit 320B to functional elements 301D-301F such that operational stress test circuit 320B can provide clock signals, control power, initiate testing and receive test output from functional elements 301D-301F.

During normal operation of integrated circuit device 300, operational stress test circuit 320A determines when one of functional elements 301A-301C is in an idle cycle and performs a stress test on the functional element 301A-301C that is in the idle cycle, during the idle cycle, and indicates failure through failure identification line 311. Similarly, during normal operation of integrated circuit device 300 operational stress test circuit 320B determines when one of functional elements 301D-301F is in an idle cycle and performs a stress test on the functional element 301D-301F that is in the idle cycle, during the idle cycle, and indicates failure through failure identification line 311.

Chip-level operational diagnostic block 304 is electrically coupled to operational stress test circuits 320A-320B and collects and coordinates failure detection 311 from built-in stress self-tests conducted by operational stress test circuits 320A and 320B. In the present embodiment, a chip-level operational diagnostic block receives error indications and generates a log or other indicia that identifies those functional elements that have failed a stress test.

Continuing with FIG. 3, it is appreciated that system 300 could include more or fewer operational stress test circuits, and that each operational stress test circuit could test more or fewer functional elements than is shown in FIG. 3.

Figure 4:
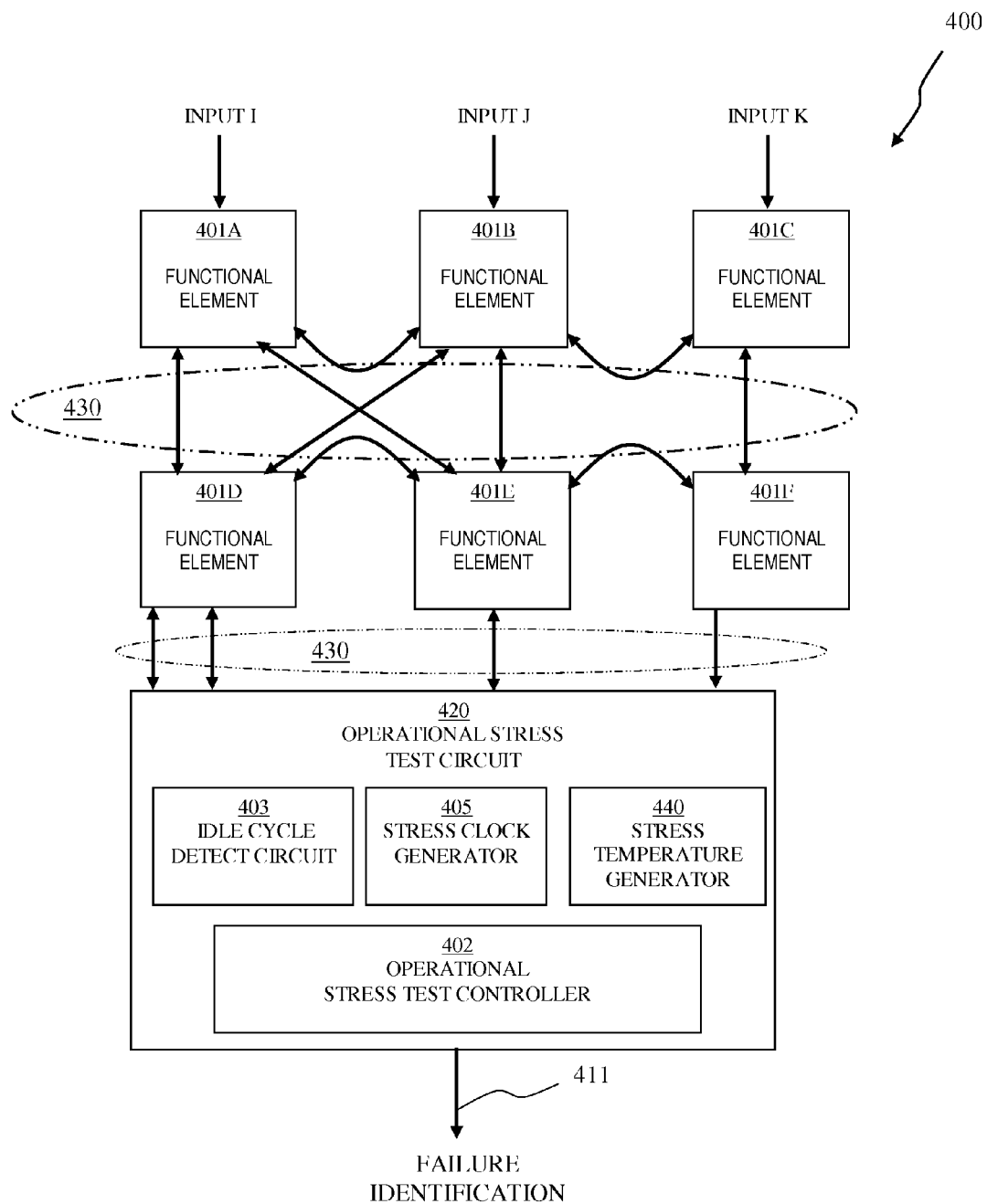
FIG. 4 illustrates a functional block diagram of an apparatus for predicting a failure of a functional element of an interconnect-architecture integrated circuit device in accordance with an embodiment of the present invention.

FIG. 4 illustrates a functional block diagram of an interconnect-architecture integrated circuit device 400 in accordance with an embodiment of the present invention. It is noted that programmable logic devices such as complex programmable logic devices, field-programmable gate arrays and the like are often constructed of multiple functional elements interconnected by selectable or deselectable interconnections as shown in interconnect-architecture integrated circuit device 400.

In interconnect-architecture integrated circuit device 400, functional elements 401A through 401F are shown interconnected by links in the interconnection matrix 430. Various links are shown as being selected in the matrix. In one embodiment, operational stress test circuit 420 is implemented in one programmable functional block in an array of programmable functional blocks. In another embodiment, operational stress test circuit 420 is a separate, dedicated, circuit. By being coupled into the interconnect matrix 430, operational stress test circuit 420 is enabled to implement built-in stress self-testing in the functional elements 401A through 401F.

In one embodiment, built-in stress self-test is implemented by operational stress test circuit 420. In another embodiment, built-in stress self-test control is implemented in a dedicated circuit block.

Operational stress test circuit 420 includes idle cycle detect circuit 403, operational stress test controller 402, stress temperature generator 440 and stress clock generator 405. Idle cycle detect circuit 403 is operable to read the function select logic in interconnect matrix 430 and inform operational stress test circuit 420 when a functional element is in an idle cycle.

In this embodiment of the present invention, operational stress test circuit 420 implements built-in stress self-testing of functional elements 410A through 410F and indicates failing functional elements by failure identification 411. When operational stress test circuit 420 identifies a failing functional element from built-in stress self-testing, the identity of the failing functional element is sent to a built-in self-repair device or to system management.

In one embodiment each of devices 200, 300 and 400 are operable to perform method 100 of FIG. 1 such that functional elements that are subject to future failure are identified, during normal operation, without disruption of the normal operation of the integrated circuit device.

In one embodiment each of devices 200, 300 and 400 include a built-in self repair circuit that is coupled to an operational stress test circuit. This built-in self repair circuit is operable, when a functional element fails the stress test, to repair some or all of the functional elements that fail the stress test. In a critical application, such as a router in a critical network for example, such pre-emptive repair can prevent the loss of service that a failure during operation can entail.

Figure 5:
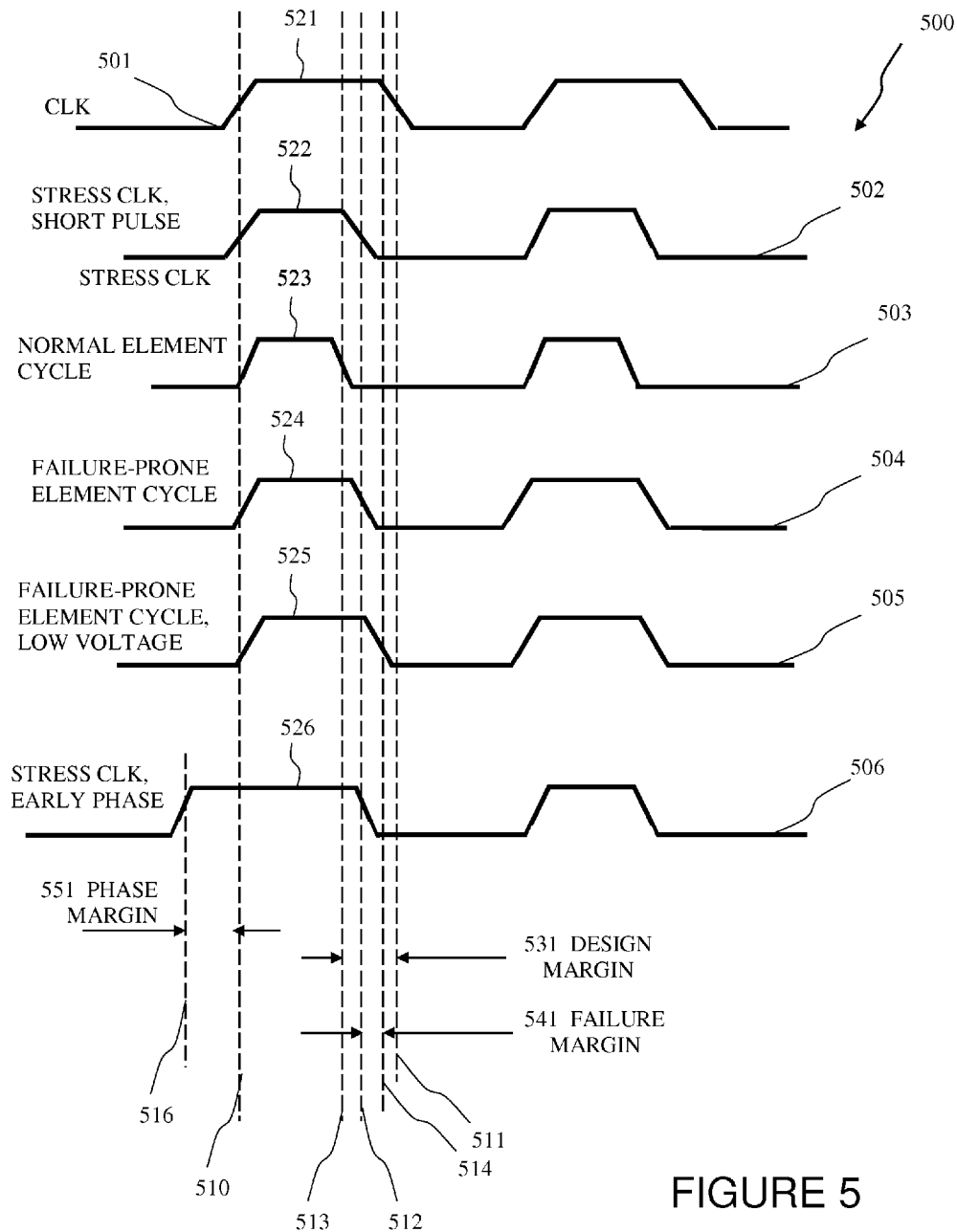
FIG. 5 illustrates time lines of stress testing of a functional element of an integrated circuit device in accordance with an embodiment of the present invention.

In accordance with various embodiments of the present invention, stress testing of the functional element at an elevated temperature may include both the application of a standard test to analyze the effects of temperature stress alone on the functional element, in addition to the application of additional timing and margin stresses to the functional element to analyze the effects of both temperature and timing and/or margin stresses on the functional element. In a particular embodiment, the functional element is first subjected to an elevated temperature and then additional timing and margin stresses are applied during the elevated temperature. FIG. 5 illustrates timing and margin stress testing of a functional element of an integrated circuit device, while the temperature of the functional element is elevated, in accordance with an embodiment of the present invention. More particularly, FIG. 5 is a time line diagram of clock signals 500 with signal traces depicting cycling of functional elements. Signal 501 is the normal internal clock signal that coordinates the workings of the integrated circuit device, both internally and, with a global clock signal, externally with the system. In this illustration, the normal internal clock signal 501 has a rising threshold 510.

Signal 502 is a stress clock signal. The stress clock signal 502 has, in this embodiment, a shorter duration pulse 522 than the duration pulse 521 of the normal clock signal 501. In one embodiment, the shorter pulse "on" cycle time of the stress clock can show a failure in a functional element of an integrated circuit device that otherwise would escape notice. Some element functions can be completed, by a weakening functional element, within the normal clock on cycle but not within the shorter stress clock on cycle.

It is noted that a function requiring a single clock pulse, or "tick" can be any one of a number of functions. For a memory cell, the function can be a read and write cycle. For a logic gate array, the function can be a Boolean operation. In each embodiment, the built-in stress self-test tests the functional element using a task relevant to its normal function. The duration of a clock pulse is designed to be as small as possible, to achieve as much speed as possible, yet allow the time necessary for a functional element to carry out its functions. Typically, a clock pulse length is the minimum time required plus a margin whose length is determined by design. Time-margin stress testing is implemented in order to identify those unhealthy or failure-prone functional elements whose state of health causes a lag in performing of a functional cycle.

Signal 503 illustrates an operating cycle of a normally functioning element. In one embodiment, the functional element is a logic gate array that performs a Boolean operation in one normal clock cycle. When threshold 510 is exceeded during the rise time 501 of normal clock pulse 521, the functional element commences cycle 523. In a normally operating functional element, the cycle is completed with a design margin 531 to spare before the end of the normal clock pulse 521. In this exemplary embodiment, the design margin 531 extends from 513 to the falling threshold 511 of the normal clock pulse 521.

The operating cycle of a failure-prone, or unhealthy, functional element is shown by signal trace 504. The failure-prone element completes its operational cycle 524 in a longer time than a healthy element, but still well within the pulse length 521 of the normal clock cycle.

In one embodiment of the present invention, the stress clock signal 502 is used to stress test a functional element during idle cycles. Whereas the length of the normal clock pulse 521 extends from rising threshold 510 to falling threshold 511, the stress clock signal pulse 522 only extends from rising threshold 510 to stress clock falling threshold 512. The shortened pulse length 522 of stress clock signal 502, in this embodiment, is equal to the normal clock pulse 521 length minus the design margin 531.

When a healthy functional element is stress tested, using the shortened pulse 522 of the stress clock 502, the test cycle is completed within the shortened test pulse length between rising threshold 510 and stress clock falling threshold 512. In this case, no anomaly or potential failure is identified.

When an unhealthy, or failure-prone, functional element is stress tested, the cycle 524 takes additional time. If the failure-prone functional element completes a test cycle after the falling threshold 512 of the stress clock 502, the functional element is identified as a potentially failing element even though it is fully functional during normal operations.

However, in some types of early-stage failure, an unhealthy functional element can take a longer time to complete a test cycle than a healthy functional element does, but still complete it within the stress clock pulse 522. When stress tested, the cycle is completed before the stress clock pulse falling threshold 512. Even though the element is unhealthy and a potentially failing element, no anomaly is noted in the stress testing because the test cycle 524 is completed within the stress clock cycle 522.

In one embodiment of the present invention, however, stress testing also includes subjecting the tested functional element to a reduced supply voltage in addition to the shortened stress clock cycle 522. A failure-prone element cycle having a reduced supply voltage is illustrated by signal trace 505. With the lowered supply voltage, a test cycle 525 will take more time, exceeding the length of stress clock pulse 522 by failure margin 541. In this case, the failure margin 541 is the length of time between the falling edge 512 of the stress clock pulse 502 and the falling edge 514 of the signal trace 505. The additional stress imposed in the stress testing by the use of reduced supply voltage enables this embodiment to identify weak elements at an earlier stage before failure. This additional stress testing affords more planning and workaround time.

Signal trace 506 illustrates another stress clock signal. Stress clock signal 506 has the same pulse duration 526 as the normal clock signal pulse 521. However, stress clock signal 506 is phased ahead of normal clock signal 501. The phase margin 551 between normal clock signal 501 and stress clock signal 506 represents the timing margin discussed above. When a stress test is executed using stress clock signal 506, the test operation is commenced on the rising threshold 510 of normal clock pulse 521 but is timed to the falling threshold 512 of stress clock signal 526. Again, the failure to complete the test operation before the falling threshold indicates a failing functional element.

In addition, the stress testing utilizing the stress clock signals 502 and 506 as described above can be implemented during an elevated temperature of the functional element. Wherein the temperature of the functional element is elevated using the stress temperature generator as previously described.

Figure 6A:
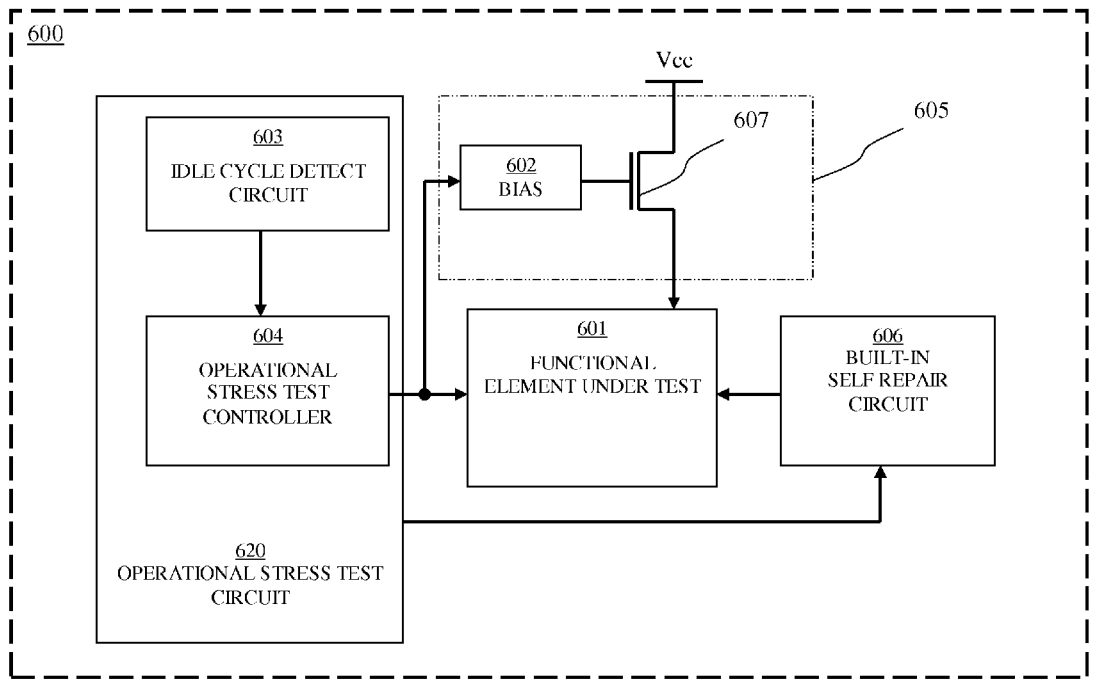
FIG. 6A illustrates a functional block diagram of an integrated circuit device in accordance with an embodiment of the present invention.

FIG. 6A illustrates a functional block diagram of an integrated circuit device 600 in accordance with an embodiment of the present invention. Integrated circuit device 600 includes an apparatus for controlling the voltage, 602 and 607, to a functional element under test 601. A lowered voltage enables one type of voltage-margin stress testing of a functional element of an integrated circuit. A higher voltage elevates the temperature of the functional element of the integrated circuit. When functional element 601 is subjected to elevated temperature stress testing by operational stress test circuit 620 which includes operational stress test controller 604 and idle cycle detect circuit 603, operational stress test controller 604 can increase the supply voltage to functional element 601 to implement the temperature elevation. In this embodiment, voltage biasing device 602 and $V_{CC}$-controlling MOSFET 607 form a high supply voltage generating circuit 605 that is operable to increase the supply voltage to the functional element. When functional element 601 is subjected to stress testing by operational stress test circuit 620 which includes operational stress test controller 604 and idle cycle detect circuit 603, operational stress test controller 604 can reduce the supply voltage to functional element 601 to implement the voltage margining. Operational stress test controller 604 signals voltage biasing device 602 to increase or decrease the gate voltage $V_{GS}$ to the gate of $V_{CC}$-controlling MOSFET 607. Increasing the gate voltage $V_{GS}$ to the gate of $V_{CC}$-controlling MOSFET 607 lowers the supply voltage to functional element 601. In this way, functional element 601 can be simultaneously subjected to a stress clock signal from operational stress test controller 604 and reduced supply voltage $V_{CC}$. Decreasing the gate voltage $V_{GS}$ to the gate of $V_{CC}$-controlling MOSFET 607 raises the supply voltage to functional element 601. In this way, the temperature of functional element 601 can be elevated through increased leakage In one embodiment, as shown in FIG. 6A, integrated circuit device 600 also includes a built-in self repair circuit (BISR) 606. Built-in self repair circuit 606 is enabled to perform a repair to functional element 601 if a result of a stress test of functional element 601 indicates a repair is necessary. In one embodiment, when the stress test performed by operational stress test circuit 620 indicates that a portion of functional element 601 is failing, or is likely to fail in the future, built-in self repair circuit 606 is operable to disconnect the indicated failing portion of functional element 601 internally and connect a spare portion to accomplish the same function during normal operation of integrated circuit device 600. Accordingly testing and repair is performed in an automated fashion, without requiring that integrated circuit device 600 be taken off-line.

Figure 6B:
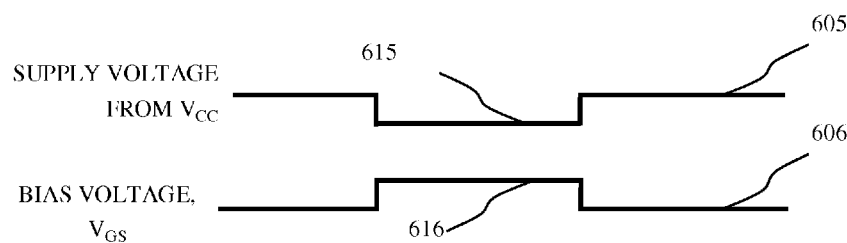
FIG. 6B illustrates a margining voltage for stress testing a functional element of an integrated circuit device in accordance with an embodiment of the present invention.

FIG. 6B illustrates the reduced voltage of a lowered voltage margining test. Operational stress test controller 604 signals voltage biasing device 602 to increase, 616, the voltage $V_{GS}$ 606 to the gate of $V_{CC}$-controlling transistor 607. This lowers, 615, supply voltage 605. In this way, functional element 601 is subjected to a reduced supply voltage. When also tested with time margining, functional element 601 can be simultaneously subjected to a shortened stress clock signal from operational stress test controller 604 and reduced supply voltage 605.

Figure 7:
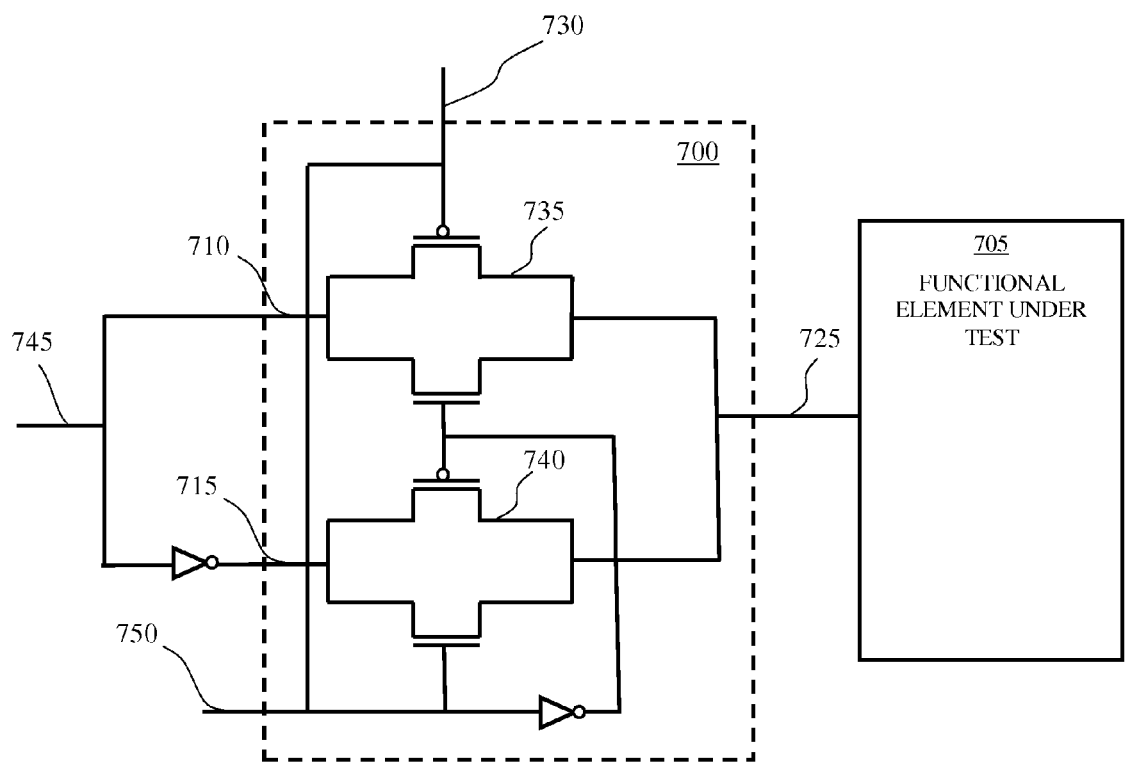
FIG. 7 illustrates a 2-to-1 multiplexer of the stress temperature generator for elevating the temperature of a functional element of an integrated circuit device in accordance with an embodiment of the present invention.

In addition to elevating the temperature of the functional element by raising the supply voltage as described with reference to FIG. 6, the temperature of the functional element can also be raised by toggling an input to the functional element at a rate that is higher than the normal operational clock rate of the functional element. In a particular embodiment, the stress temperature generator includes a 2-to-1 multiplexer to toggle the input to the functional element. With reference to FIG. 7, an embodiment of the 2-to-1 multiplexer of the stress temperature generator in accordance with an embodiment of the present invention is illustrated. In this embodiment, the stress temperature generator is operable to elevate the temperature of the functional element 705 by hyper-toggling the input 725 to the functional element 705 utilizing the 2-to-1 multiplexer 700. The illustrated embodiment of the stress temperature generator includes a 2-to-1 multiplexer circuit 700 comprising two pass-gates 735, 740. Pass-gates are known in the art to include a p-type and a n-type transistor operating in parallel. A logic signal pattern input 745 to the multiplexer is coupled to the input 710 of the first pass gate 735 and the inverted version of the logic signal pattern is coupled to the input 715 of the second pass gate 740. In this embodiment, based on the clock signal received at the select input of the multiplexer 750, the multiplexer 700 passes the logic signal pattern from the first input 710 to the output 725 on the first half of the clock cycle and passes the inverted signal pattern from the second input 715 to the output 725 on the second half of the clock cycle. As such, the output 725 of the multiplexer 700 is toggled at twice the normal clock rate of the functional element. The output 725 is coupled to the functional element 705 which results in an elevation of the temperature of the functional element above a normal operating temperature due to the increased charging and discharging of the devices as a result of the hyper-toggling at the increased clock rate. The use of a two pass gate multiplexer as described has negligible impact on the performance of the integrated circuit because it only imposes a delay of one pass gate during normal operation of the functional element. Logic registers can provide the inverted logic signal as a natural result of implementation. Various logic signal patterns can be used to toggle the input to the functional element. In addition larger multiplexers can be used to toggle the output at increased frequencies to further elevate the temperature of the functional element.

Figure 8:
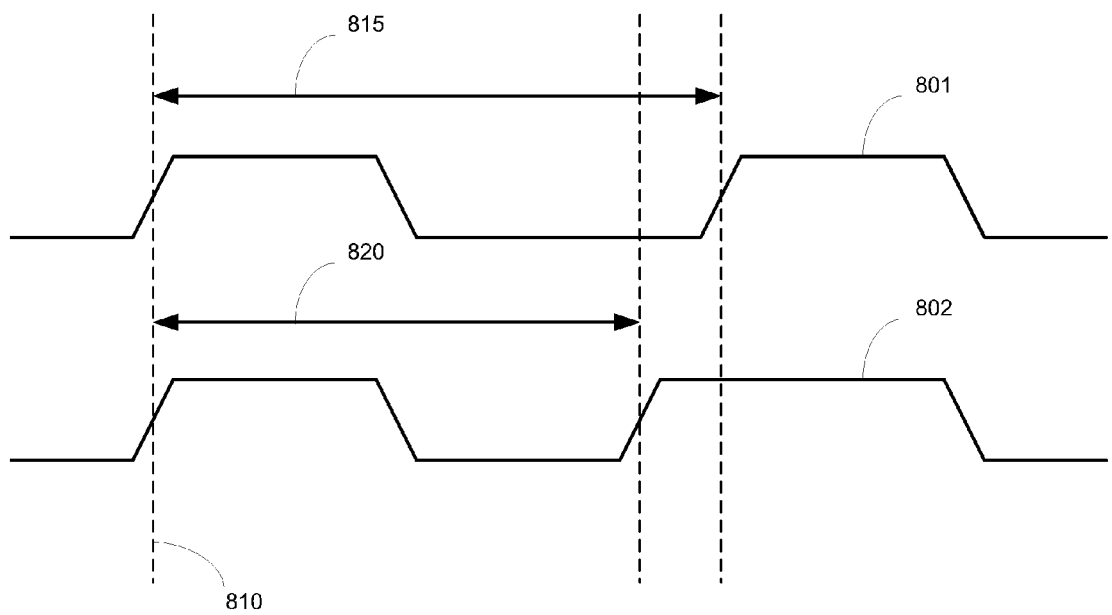
FIG. 8 illustrates a timing diagram for stress testing of a functional element in accordance with the present invention.

FIG. 8 illustrates a more detailed time line of a stress clock signal 802 in accordance with an embodiment of the present invention. In this embodiment, signal 801 is the normal internal clock signal that coordinates the workings of the integrated circuit device, both internally and, with a global clock signal, externally with the system. In this illustration, the normal internal clock rising threshold 810 is shared by the stress clock signal 802 and the normal clock signal 801. The stress clock signal 802 and the normal clock signal 801 have the same frequency but the duty cycle of the stress clock signal 802 is shorter. The shorter duty cycle of the stress clock signal 802 results in a shorter pulse "on" cycle time of the stress clock. This shorter pulse "on" cycle time can show a failure in a functional element of an integrated circuit device that otherwise would escape notice. As such, under normal operating conditions using the normal clock signal 801, the functional element would have a normal cycle time 815 in which to complete a function requiring a single clock pulse. However, under the stress condition utilizing the stress clock signal 802, the functional element would need to complete a function requiring a single clock pulse within the shorter stress cycle time 820. Some element functions can be completed, by a weakening functional element, within the normal clock on cycle 801 but not within the shorter stress clock on cycle 802.

It is noted that a function requiring a single clock pulse, or "tick" can be any one of a number of functions. For a memory cell, the function can be a read and write cycle. For a logic gate array, the function can be a Boolean operation. In each embodiment, the built-in stress self-test tests the functional element using a task relevant to its normal function. The duration of a clock pulse is designed to be as small as possible, to achieve as much speed as possible, yet allow the time necessary for a functional element to carry out its functions. Typically, a clock pulse length is the minimum time required plus a margin whose length is determined by design. Time-margin stress testing is implemented in order to identify those unhealthy or failure-prone functional elements whose state of health causes a lag in performing of a functional cycle.

Embodiments of the present invention are enabled to detect weak or unhealthy functional elements in integrated circuit devices during operation, before failure of a functional element impinges on system operation. By early detection of possible impending failure of functional elements, critical systems using devices incorporating embodiments of the present invention are able to plan workaround and repair of the system without interruption of critical service.

In a particular embodiment, the present invention includes a multi-core CPU which combines two or more independent cores into a single package composed of a single integrated circuit (IC). In this embodiment, an external smart power supply is used to power individual power pins for each independent core of the multi-core CPU. Additionally, the clock for each independent core is run separately from one another. In this embodiment, the stress testing process of the present invention can be used to identify unhealthy or failure-prone cores. Once a failure-prone core is identified system processing can be rerouted to avoid using the failure-prone core.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A method for identifying a potential future failing functional element in an integrated circuit during normal operation of the integrated circuit, the method comprising:
   determining whether the functional element of the integrated circuit is in an idle cycle;
   elevating the temperature of the functional element above a normal operating temperature when the functional element is determined to be in the idle cycle;
   performing a stress test of the functional element while the temperature of the functional element is at the elevated temperature and the functional element is in the idle cycle; and
   if the functional element fails the stress test, indicating that the functional element is a potential future failing functional element.

2. The method described in claim 1, wherein elevating the temperature of the functional element above the normal operating temperature further comprises applying a stress temperature input to the functional element.

3. The method described in claim 2, wherein applying the stress temperature input to the functional element further comprises toggling a logic input to the functional element with a logic signal pattern at a clock rate that is faster than a normal internal clock signal used by the functional element.

4. The method described in claim 3, wherein the logic input is toggled at twice the normal internal clock signal used by the functional element.

5. The method described in claim 2, wherein applying the stress temperature input to the functional element further comprises driving a supply voltage input of the functional element with a voltage that is higher than a normal operating voltage of the functional element.

6. The method of claim 2, further comprising discontinuing the application of the stress temperature input prior to performing the stress test of the functional element.

7. The method described in claim 1, wherein performing a stress test further comprises providing a margining test voltage to the functional element.

8. The method described in claim 1, wherein performing a stress test further comprises providing a stress clock signal wherein a pulse of the stress clock signal terminates earlier than a contemporary pulse of a normal internal clock signal used by the functional element.

9. The method described in claim 8, wherein each pulse of the stress clock signal is approximately equal to each pulse of the normal internal clock signal minus a design margin.

10. The method described in claim 1, wherein performing a stress test further comprises:
providing a margining test voltage to the functional element; and
providing a stress clock signal to the functional element.

11. The method described in claim 10, wherein each pulse of the stress clock signal is approximately equal to each pulse of the normal internal clock signal minus a design margin.

12. The method described in claim 1, wherein performing a stress test further comprises running a standard test on the functional element.

13. The method described in claim 12, wherein the standard test is performed using the normal internal clock signal of the functional element.

14. The method described in claim 1, further comprising measuring the elevated temperature of the functional element.

15. The method described in claim 14, further comprising correlating the measured temperature of the functional element with the stress temperature input if the functional element fails the stress test.

16. An integrated circuit device comprising:
a functional element; and
an operational stress test circuit coupled to the functional element and operable during normal operation of the integrated circuit device to elevate the temperature of the functional element above a normal operating temperature and to perform stress testing on the functional element when the functional element is in an idle cycle and at the elevated temperature.

17. The integrated circuit device described in claim 16, wherein the operational stress test circuit further comprises:
an idle cycle detect circuit for determining when the functional element is in an idle cycle;
an operational stress test controller coupled to the idle cycle detect circuit, the operational stress test controller further operable to indicate if the functional element fails the stress testing; and
a stress temperature generator coupled to the operational stress test controller, the stress temperature generator operable to elevate the temperature of the functional element above the normal operating temperature.

18. The integrated circuit device described in claim 17, wherein the operational stress test circuit further comprises a stress clock generator coupled to the operational stress test controller, the stress clock generator operable to generate a stress clock signal.

19. The integrated circuit device described in claim 17, further comprising a temperature sensor coupled to the functional element and to the operational stress test controller for measuring the elevated temperature of the functional element.

20. The integrated circuit device described in claim 17, wherein the stress temperature generator is operable to elevate the temperature of the functional element by toggling a logic input to the functional element with a logic signal pattern at a clock rate that is faster than a normal internal clock signal used by the functional element.

21. The integrated circuit device described in claim 17, further comprising a high supply voltage generating circuit coupled to the operational stress controller and the stress temperature generator, the high supply voltage generating circuit operable to elevate the temperature of the functional element by driving a supply voltage input of the functional element with a voltage that is higher than a normal operating voltage of the functional element.

22. The integrated circuit device described in claim 20, wherein the stress temperature generator further comprises a 2-to-1 pass-gate multiplexer circuit to provide the logic signal pattern to toggle the logic input to the functional element.

23. The integrated circuit device described in claim 16, further comprising a built-in repair circuit for repairing the functional element when the functional element fails the stress test.

24. An integrated circuit device comprising:
a functional element; and
an operational stress test circuit coupled to the functional element and operable during normal operation of the integrated circuit device to elevate the temperature of the functional element above a normal operating temperature and to perform stress testing on the functional element when the functional element is in an idle cycle and at the elevated temperature, the operational stress test circuit further comprising;
an idle cycle detect circuit for determining when the functional element is in an idle cycle;
a stress temperature generator coupled to the operational stress test controller, the stress temperature generator operable to elevate the temperature of the functional element above the normal operating temperature; and
an operational stress test controller coupled to the idle cycle detect circuit, the operational stress test controller further operable to indicate if the functional element fails the stress testing.

25. The integrated circuit device described in claim 24, wherein the stress temperature generator is operable to elevate the temperature of the functional element by toggling a logic input to the functional element with a logic signal pattern at a clock rate that is faster than a normal internal clock signal used by the functional element.

26. The integrated circuit device described in claim 25, wherein the stress temperature generator further comprises a 2-to-1 pass-gate multiplexer circuit to provide the logic signal pattern to toggle the logic input to the functional element.

27. The integrated circuit device described in claim 24, further comprising a high supply voltage generating circuit coupled to the operational stress controller and the stress temperature generator, the high supply voltage generating circuit operable to elevate the temperature of the functional element by driving a supply voltage input of the functional element with a voltage that is higher than a normal operating voltage of the functional element.

* * * * *

UNITED STATES PATENT AND TRADEMARK OFFICE
CERTIFICATE OF CORRECTION

PATENT NO.        : 8,028,211 B1
APPLICATION NO.   : 12/268854
DATED             : September 27, 2011
INVENTOR(S)       : Michael Miller and Chuen-Der Lien It is certified that error appears in the above-identified patent and that said Letters Patent is hereby corrected as shown below:

Column 4, line 7, "GIST" should read --BIST--

Signed and Sealed this
Twentieth Day of March, 2012

David J. Kappos
*Director of the United States Patent and Trademark Office*